United States Patent
Hsiao et al.

(10) Patent No.: US 6,261,912 B1
(45) Date of Patent: Jul. 17, 2001

(54) METHOD OF FABRICATING A TRANSISTOR

(75) Inventors: Chih-Yuan Hsiao, Feng-Shan; Yao-Chin Cheng, Chi-Lung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/372,432

(22) Filed: Aug. 10, 1999

(51) Int. Cl.$^7$ .................................... H01L 21/336
(52) U.S. Cl. ........................ 438/301; 438/302; 438/305
(58) Field of Search .................................... 438/296, 297, 438/301, 302, 239

(56) References Cited

U.S. PATENT DOCUMENTS

| | | | |
|---|---|---|---|
| 5,472,890 | * 12/1995 | Oda | 437/41 |
| 5,491,099 | * 2/1996 | Hsu | 437/35 |
| 5,635,417 | * 6/1997 | Natsume | 438/130 |
| 5,705,414 | * 1/1998 | Lustig | 437/41 |
| 5,783,457 | * 7/1998 | Hsu | 437/35 |
| 5,834,355 | * 11/1998 | Doyle | 438/305 |
| 5,899,719 | * 5/1999 | Hong | 438/289 |

* cited by examiner

Primary Examiner—John F. Niebling
Assistant Examiner—Walter L. Lindsay, Jr.
(74) Attorney, Agent, or Firm—Thomas, Kayden, Horstemeyer & Risley, LLP

(57) ABSTRACT

A method of fabricating a transistor. A gate structure is formed on a substrate. A spacer is formed on a sidewall of the gate structure. A first doping step is performed with the gate structure and the spacer serving as masks to form a source/drain region in the substrate. A silicide layer is formed on the source/drain region. The spacer is removed. A second doping step is performed with the gate structure serving as a mask to form a lightly doped drain region in the substrate.

20 Claims, 5 Drawing Sheets

METHOD OF FABRICATING A TRANSISTOR

BACKGROUND OF THE INVENTION

1. Field of the Invention

The present invention relates to a semiconductor fabrication method. More particularly, the present invention relates to a method of fabricating a transistor.

2. Description of the Related Art

Conventionally, a self-aligned silicide layer, also known as a salicide layer, is formed on a source/drain region, which is located on opposite sides of a gate, so as to decrease the resistance for a transistor.

FIGS. 1A through 1F are schematic, cross-sectional views illustrating a conventional method of fabricating a transistor.

In FIG. 1A, a gate 106 is formed on a substrate 100. The gate 106 comprises a gate oxide layer 102 and a polysilicon layer 104 formed in sequence over the substrate 100. A shallow trench isolation (STI) structure 108 is formed in a portion of the substrate 100.

In FIG. 1B, a light doping step is performed with the gate 106 serving as a mask. A lightly doped drain (LDD) region 110, which has a pocket-doped region, is formed in the substrate 100 on opposite sides of the gate 106.

In FIG. 1C, an oxide layer (not shown) is formed by chemical vapor deposition over the substrate 100 to cover the gate 106. Anisotropic etching is performed to etch the oxide layer. A spacer 112 is formed on a sidewall of the gate 106.

In FIG. 1D, a doping step is performed with the gate 106 and the spacer 112 serving as masks. Arsenic (As) ions are doped into the substrate 100. The arsenic-doping step is performed with a high energy of about 60–80 KeV and a high dosage of about 3E15 atoms/cm². A source/drain region 114 is formed in the substrate 100 on opposite sides of the spacer 112.

In FIG. 1E, a titanium layer 116 having a thickness of about 200 angstroms to about 1000 angstroms is formed over the substrate 100 by sputtering.

In FIG. 1F, a thermal step is performed. During the thermal step, the titanium layer 116 reacts with the silicon of the gate 106 and the source/drain region 114 to form silicide layers 118, known as self-aligned silicide layers. A wet etching is performed with a $H_2O_2$ solution and a $NH_4OH$ solution to remove the unreacted titanium layer 116.

In the above-described fabrication process, the source/drain region 114 is formed by doping the arsenic (As) ions with a high energy of about 60–80 KeV and a high dosage of about 3E15 atoms/cm². During the high-energy ion bombardment, dislocations are easily formed in the substrate 100 and affect the device performance. In contrast, if the source/drain region 114 is formed by doping arsenic ions having a low energy and a high dosage, dislocations in the substrate 100 can be reduced. However, even though the dislocations can be reduced in this manner, the formation of the silicide layer is partially obstructed by the high-concentration source/drain region 114. This, in turn, decreases the formation of the silicide layer, resulting in an increased resistance. In addition, the drain-induced barrier lowering (DIBL) effect can be reduced by an LDD structure formed with a low doping energy. However, in order to increase the saturated current ($I_{DSAT}$) of devices, dosages are increased. In this manner, the resistance for source/drain region 114 is affected.

Moreover, since the thermal step for forming the silicide layer 118 is performed after the formation of the source/drain region 114. In the high-temperature environment, ions in the source/drain region 114 tend to further diffuse. As a result, junction capacitance of the source/drain region 114 is increased, and thus the operation speed is affected. The junction leakage current is increased.

SUMMARY OF THE INVENTION

The invention provides a method of fabricating a transistor. A gate structure is formed on a substrate. A spacer is formed on a sidewall of the gate structure. A first doping step is performed with the gate structure and the spacer serving as masks to form a source/drain region in the substrate. A silicide layer is formed on the source/drain region. The spacer is removed. A second doping step is performed with the gate structure serving as a mask to form a lightly doped drain region in the substrate.

Preferably, dopant ions in the first doping step comprise phosphorus (P) ions. The first doping step is preferably performed with an energy of about 40–50 KeV and most preferably about 50 KeV. The first doping step is preferably performed with a dosage of about 1E13–6E13 atoms/cm² and most preferably about 3E13 atoms/cm².

Preferably, dopant ions in the second doping step comprise arsenic ions. The second doping step is preferably performed with an energy of about 5–10 KeV. The second doping step is preferably performed with a dosage of about 1E15–3E15 atoms/cm² and most preferably about 3E15 atoms/cm².

The present invention forms the source/drain region by doping phosphorus ions having a low doping energy of about 40–50 KeV. This is in order to prevent dislocations from forming in the substrate, prevent junction leakage current, and improve junction capacitance.

Moreover, the invention forms the silicide layer before the lightly doped drain region is formed. In this manner, the light doping step for forming the lightly doped drain region is performed without decreasing the formation of the silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
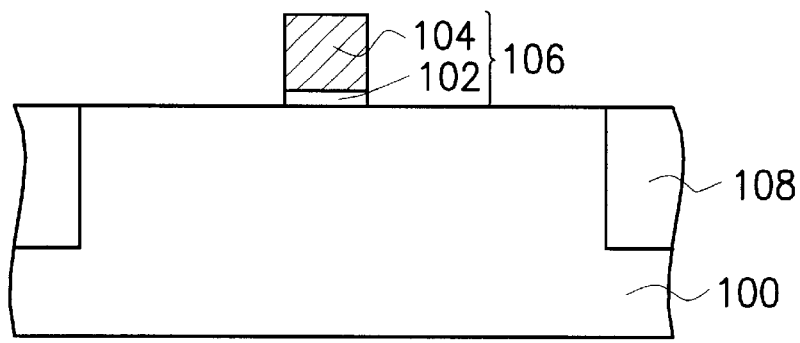
FIGS. 1A through 1F are schematic, cross-sectional views illustrating a conventional method of fabricating a transistor.
Figure 1B:
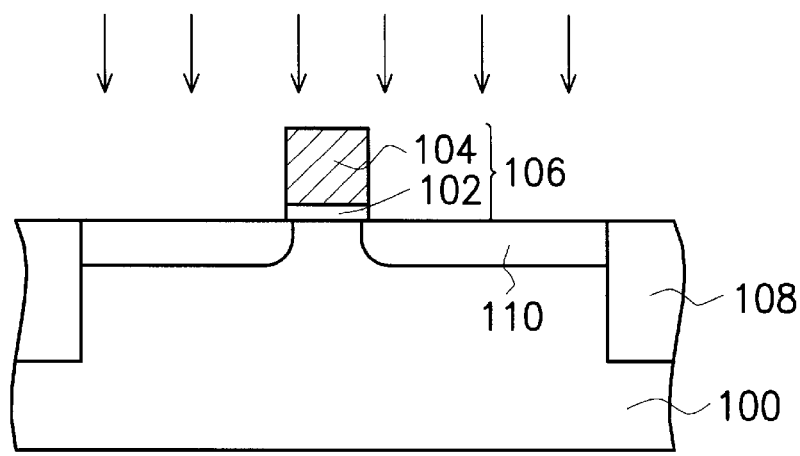
Figure 1C:
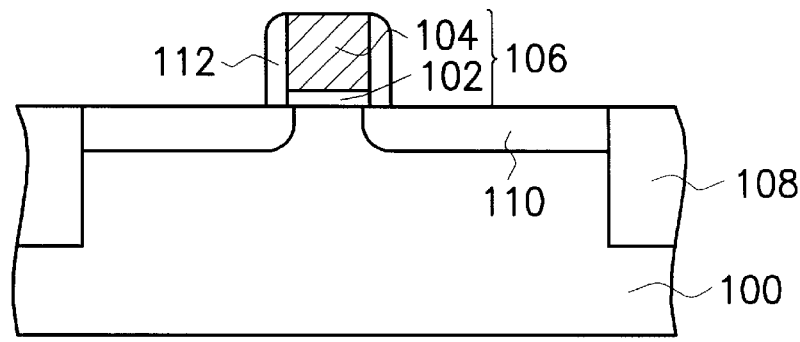
Figure 1D:
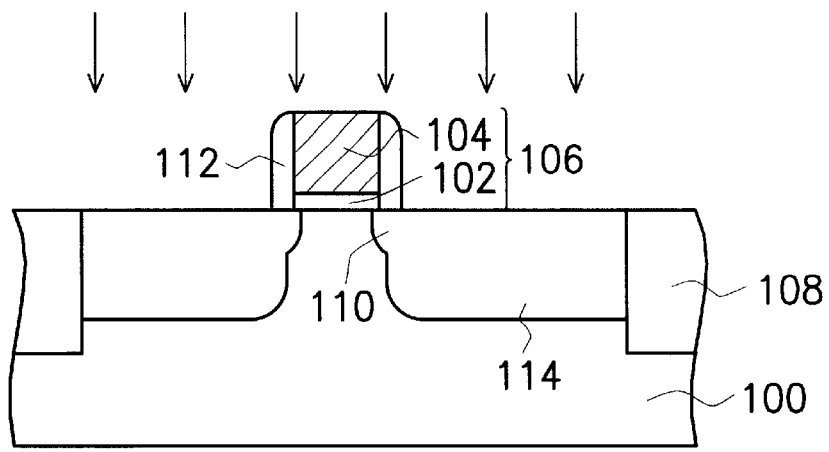
Figure 1E:
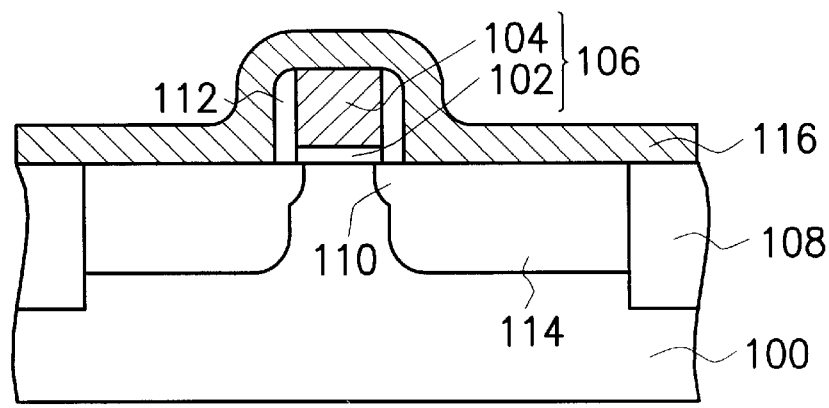
Figure 1F:
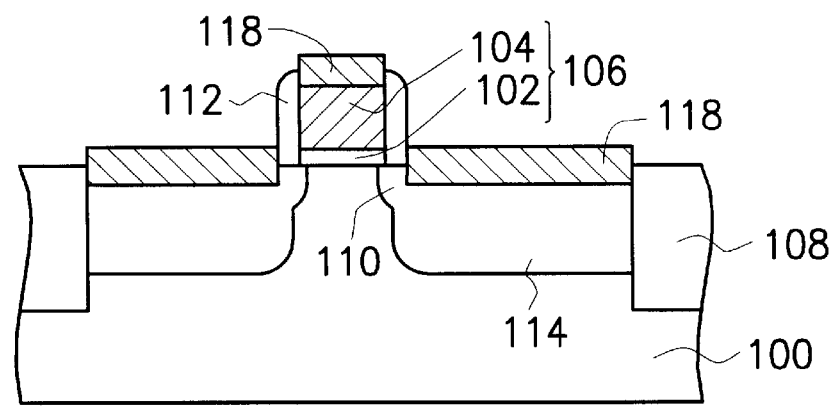

Reference will now be made in detail to the present preferred embodiments of the invention, examples of which are illustrated in the accompanying drawings. Wherever possible, the same reference numbers are used in the drawings and the description to refer to the same or like parts.

Figure 2A:
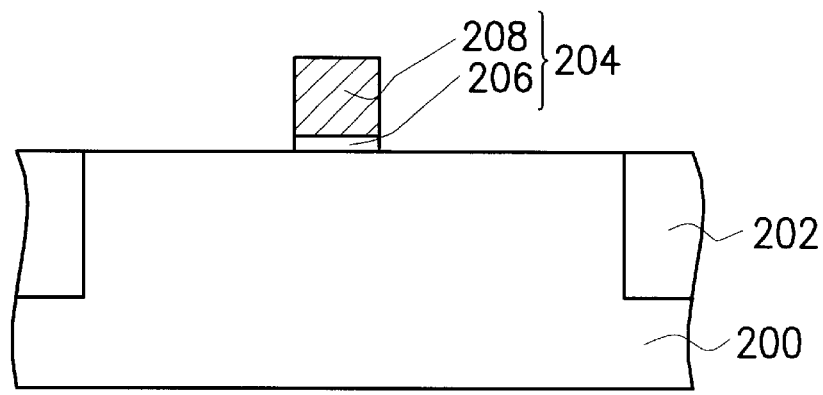
FIGS. 2A through 2G are schematic, cross-sectional views illustrating a method of fabricating a transistor according to one preferred embodiment of the invention.

In FIG. 2A, a device isolation structure 202 is formed in a substrate 200, such as a silicon substrate. The device isolation structure 202 comprises a shallow trench isolation (STI) structure and a field oxide layer (FOX). A gate structure 204 is formed on a substrate 200. The gate structure 204 comprises a gate oxide layer 206 and a gate conductive layer 208 formed in sequence over the substrate 200. The gate structure 204 can be formed by the following exemplary steps. An oxide layer (not shown) is formed on the substrate 200 by thermal oxidation or chemical vapor deposition. A conductive layer (not shown), such as a polysilicon layer (not shown), is formed on the oxide layer. A photolithographic and anisotropic etching step is performed to remove portions of the oxide layer and the polysilicon layer. The gate structure 204 comprising the gate oxide layer 206 and the gate conductive layer 208 is thus formed.

Figure 2B:
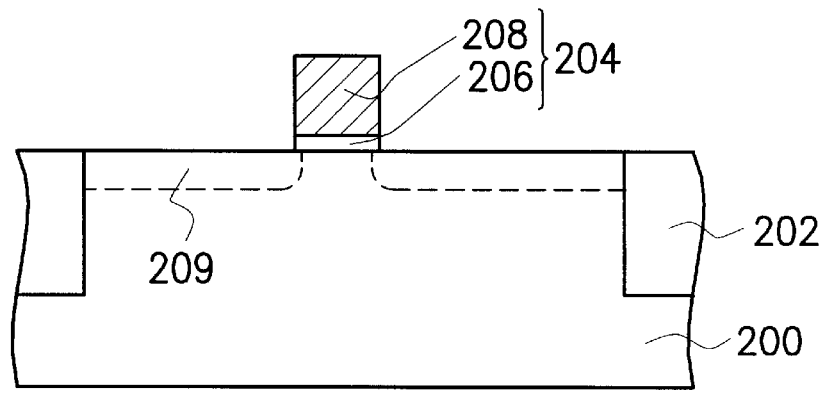

In FIG. 2B, a pocket ion implantation step is performed with the gate structure 204 serving as a mask to form a pocket-doped region 209 in the substrate 200. The pocket-doped region 209 is doped by dopants having a polarity type opposite to that of the dopants in a lightly doped drain region 218 (shown in FIG. 2G). In this manner, the pocket-doped region 209 prevents the occurrence of the current leakage from the lightly doped drain region 218 (shown in FIG. 2G).

Figure 2C:
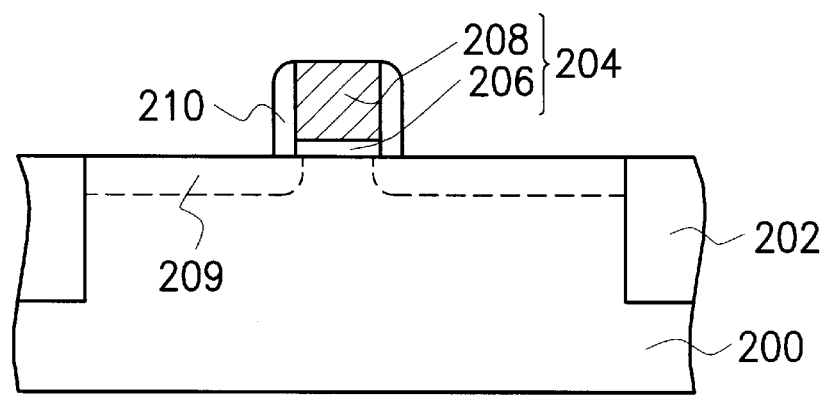

In FIG. 2C, a spacer 210 is formed on a sidewall of the gate structure 204. The material of the spacer 210 comprises silicon nitride and silicon oxide. The spacer 210 can be formed by, for example, first forming a silicon oxide layer (not shown) over the substrate 200 by chemical vapor deposition, and then performing an anisotropic etching to etch the silicon oxide layer to form the spacer 210.

Figure 2D:
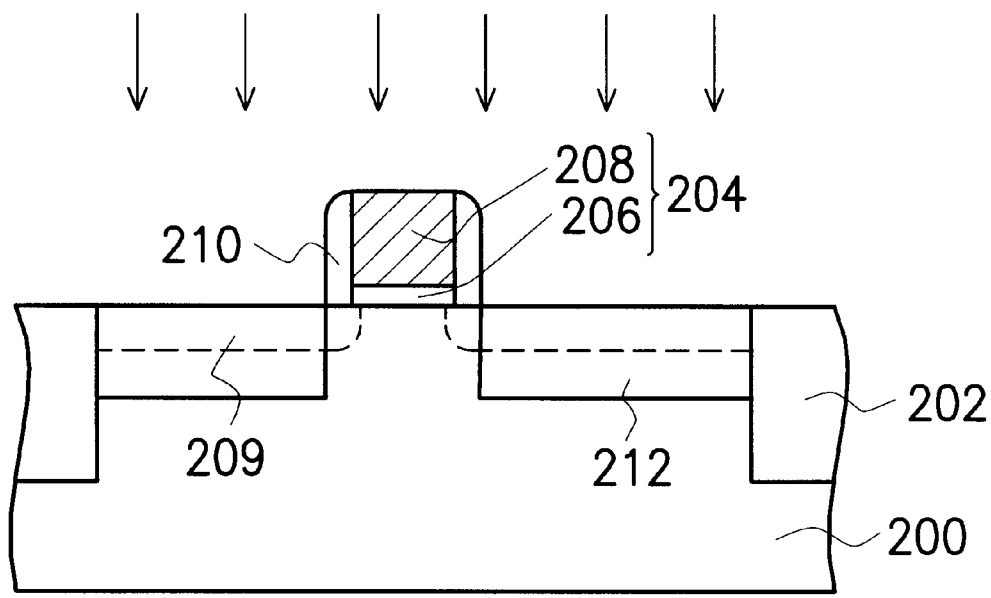

In FIG. 2D, a first doping step is performed with the gate 204 and the spacer 210 serving as masks. A source/drain region 212 is formed in the substrate 200 on opposite sides of the spacer 210. In the first doping step, dopant ions are preferably phosphorus ions. The firsts doping step is preferably performed with an energy of about 40–50 KeV, and most preferably 50 KeV. The first doping step is preferably performed with a dosage of about 1E13–6E13 atoms/cm², and is most preferably 3E13 atoms/cm². Since energy for the phosphorus ions is low, chances for forming the dislocations in the substrate 200 are decreased. Commonly, a rapid thermal process is performed after the first doping step to make the ions in the substrate 200 spread homogeneously.

Figure 2E:
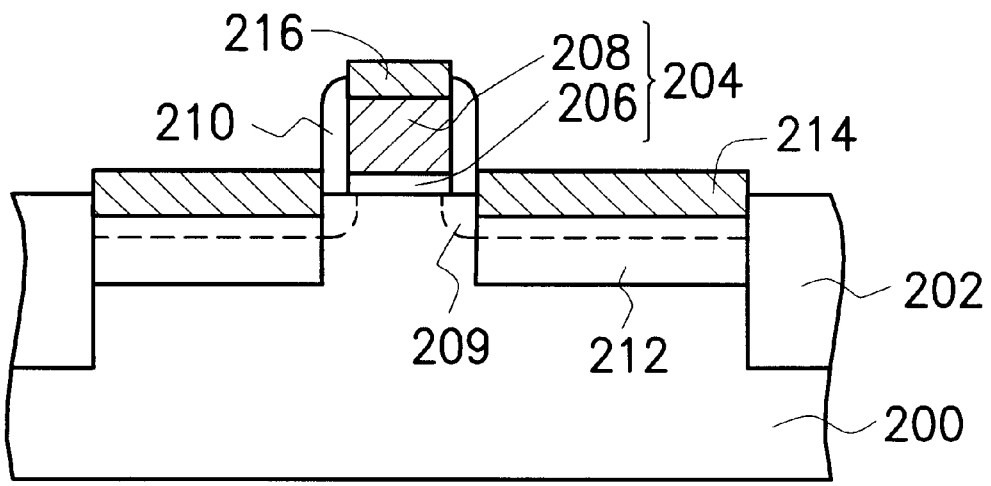

In FIG. 2E, a silicide layer 214 is formed on the source/drain region 212. The silicide layer 214 can be formed by, for example, a self-aligned silicide process described as follows. A metallic layer (not shown) is formed over the substrate 200 to cover the gate structure 204 and the source/drain region 212. The material of the metallic layer comprises titanium, tungsten, cobalt, nickel, platinum, or titanium. An annealing step is performed by, for example, a rapid thermal process. The metallic layer and the source/drain region 212 react to form a silicide layer 214. If the gate conductive layer 208 is a polysilicon layer, another silicide layer 216 is formed on the gate conductive layer 208. The unreacted metallic layer is removed by, for example, wet etching or dry etching.

Figure 2F:
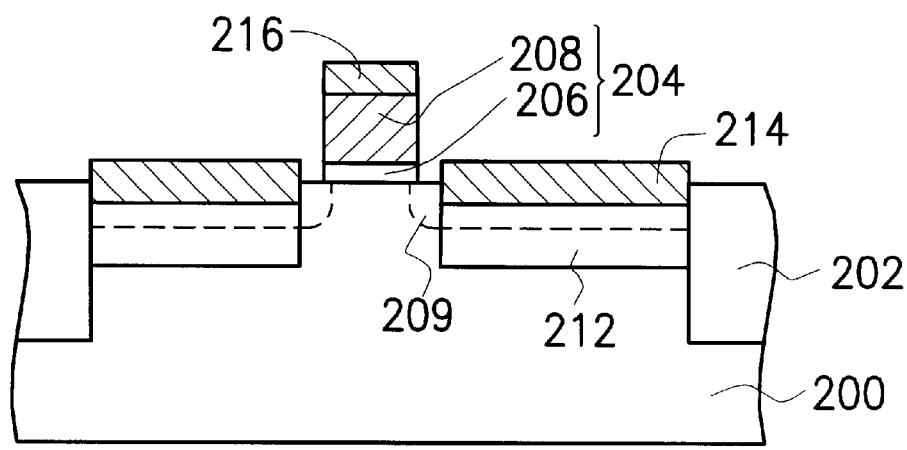

In FIG. 2F, the spacer 210 is removed. The spacer 210 can be removed by, for example, wet etching.

Figure 2G:
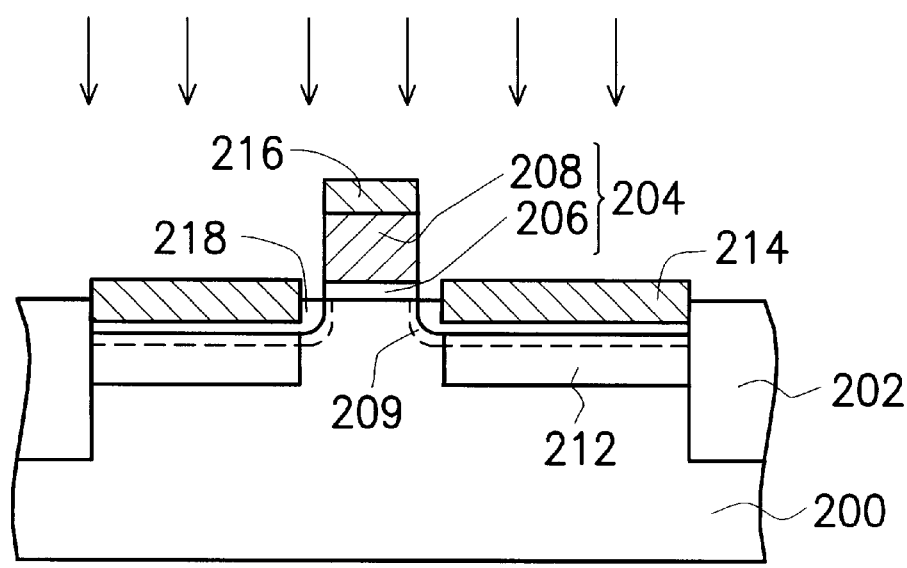

In FIG. 2G, a light doping step is performed with the gate 204 serving as a mask. A lightly doped drain (LDD) region 218 is formed in the substrate 200. In the light doping step, arsenic (As) ions are preferably doped into the substrate 200 with a preferred energy of about 5–10 KeV. The doping dosage is about 1E15–3E15 atoms/cm², and preferably is about 3E15 atoms/cm². Commonly, a rapid thermal process is performed to make the doped ions spread homogeneously after the light doping step.

Table 1 shows properties of the transistors formed by the present invention and the conventional method using simulation calculation. In Table 1, L_GATE represents linewidth. SD represents the ion species, dosage, and energy while forming the source/drain region. $X_j$ represents the doping depth of the source/drain region. $V_T$ represents the threshold voltage. SS represents sub-threshold swing. $I_{DSAT}$ represents saturated current. $I_{off}$ represents the current while the transistor is turned off. DIBL represents drain-induced barrier lowering.

TABLE 1

| | L_GATE | SD | $X_j$ | $V_\tau$ | SS | $I_{DSAT}$ | $I_{off}$ | DIBL |
|---|---|---|---|---|---|---|---|---|
| Conventional method | 0.18 | As, 3E15, 60k | 0.15 | 0.42 | 75.7 | 563 | 47.8 | 42.3 |
| Present invention | 0.18 | P, 3E13, 50k | 0.15 | 0.416 | 75.7 | 565 | 53.8 | 42.6 |

As it is shown in Table 1, the transistor formed by the present invention has a low concentration source/drain region. However, the performance of the transistor is comparable with that of the conventional. This is because phosphorus ion concentration in the source/drain region of the present invention is sufficient to maintain the performance of the transistor.

In the present invention, phosphorus ions are doped to form the source/drain region. Since the energy for doping the phosphorus ions is lower than the energy needed in the conventional method, damages occurring in the substrate are reduced. Correspondingly, dislocations and junction current leakage are reduced and junction capacitance is improved. Moreover, the dosage for doping phosphorus ions is about 1E13 atoms/cm², which is lower than the dosage for doping the arsenic ions of about 3E15 atoms/cm². Thus, in comparison with the conventional method, the silicide layer formed on the source/drain region is increased. Thus, a low resistance for the source/drain region is obtained.

In addition, the present invention forms the silicide layer before the lightly doped drain region is formed. This is in order to prevent the high concentration of arsenic ions from reducing the formation of the silicide layer.

Moreover, the invention forms the lightly doped drain region after the self-aligned silicide layer is formed. In this manner, the light doping step is performed without increasing the resistance of the source/drain region. Thus, the saturated current is increased and the DIBL effect is improved, as well. In addition, the source/drain region is formed underlying the silicide layer. Generally, defects do not generated by performing the LDD implantation through the silicide layer. However, even if the defects are generated, the defects are enclosed within the source/drain region. Therefore, the defects do not cause current leakage.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a transistor comprising:
   forming a gate structure on a substrate;

forming a spacer on a sidewall of the gate structure;

performing a first doping step with the gate structure and the spacer serving as masks to form the source/drain region in the substrate;

forming a silicide layer on the gate structure and the source/drain region;

removing the spacer; and performing a second doping step with the gate structure serving as a mask to form a lightly doped drain region in the substrate near the sides of the gate structure and under the entire silicide layer on the source/drain region.

2. The method of claim 1, wherein the first doping step comprises phosphorus ions as a dopant.

3. The method of claim 1, wherein the first doping step is performed with an energy of about 40–50 KeV.

4. The method of claim 3, wherein the first doping step is performed with an energy of about 50 KeV.

5. The method of claim 1, wherein the first doping step is performed with a dosage of about 1E13–6E13 atoms/cm$^2$.

6. The method of claim 5, wherein the first doping step is performed with a dosage of about 3E13 atoms/cm$^2$.

7. The method of claim 1, wherein the second doping step comprises arsenic ions as a dopant.

8. The method of claim 1, wherein the second doping step is performed with an energy of about 5–10 KeV.

9. The method of claim 1, wherein the second doping step is performed with a dosage of about 1E15–3E15 atoms/cm$^2$.

10. The method of claim 9, wherein the second doping step is performed with a dosage of about 3E15 atoms/cm$^2$.

11. The method of claim 1, wherein the gate structure comprises a gate oxide layer and a gate conductive layer formed in sequence over the substrate.

12. The method of claim 11, wherein the conductive layer comprises polysilicon.

13. A method of fabricating a transistor comprising:

forming a gate structure on a substrate;

performing a first doping step with the gate structure serving as a mask to form a pocket-doped region in the substrate and on both sides of the gate structure;

forming a spacer on a sidewall of the gate structure and covering portions of the pocket-doped region near the sides of the gate structure;

performing a second doping step with the gate structure and the spacer structure serving as masks to form the source/drain region in the substrate covering the pocket-doped region;

forming a silicide layer on the gate structure and the source/drain region;

removing the spacer; and performing a third doping step with the gate structure serving as a mask to form a lightly doped drain region in the substrate around the pocket-doped region and under the entire silicide layer on the source/drain region.

14. The method of claim 13, wherein the first doping step comprises phosphorus ions as a dopant.

15. The method of claim 13, wherein the first doping step is performed with an energy of about 40–50 KeV and with a dosage of about 1E13–6E13 atoms/cm$^2$, preferably with an energy of about 50 KeV and with a dosage of about 3E13 atoms/cm$^2$.

16. The method of claim 13, wherein the second doping step comprises arsenic ions as a dopant.

17. The method of claim 13, wherein the second doping step is performed with an energy of about 5–10 KeV and with a dosage of about 1E15–3E15 atoms/cm$^2$, preferably with a dosage of about 3E15 atoms/cm$^2$.

18. The method of claim 13, wherein the pocket-doped region has a conductivity type opposite to that of the lightly doped drain region.

19. The method of claim 13, wherein the gate structure comprises a gate oxide layer and a gate conductive layer formed in sequence over the substrate.

20. The method of claim 19, wherein the conductive layer comprises polysilicon.

* * * * *